(12) United States Patent
Tran et al.

(10) Patent No.: US 10,818,330 B2
(45) Date of Patent: Oct. 27, 2020

(54) FAST PROGRAMMING OF MAGNETIC RANDOM ACCESS MEMORY (MRAM)

(71) Applicant: Avalanche Technology, Inc., Fremont, CA (US)

(72) Inventors: Thinh Tran, Palo Alto, CA (US); Mourad El Baraji, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 16/264,279

(22) Filed: Jan. 31, 2019

(65) Prior Publication Data
US 2020/0251155 A1 Aug. 6, 2020

(51) Int. Cl.
*G11C 11/00* (2006.01)
*G11C 11/16* (2006.01)

(52) U.S. Cl.
CPC ........ *G11C 11/1675* (2013.01); *G11C 11/161* (2013.01); *G11C 11/1659* (2013.01); *G11C 11/1697* (2013.01)

(58) Field of Classification Search
CPC ............ G11C 11/1675; G11C 11/1697; G11C 11/161; G11C 11/1659
USPC ........................................................ 365/158
See application file for complete search history.

(56) References Cited

U.S. PATENT DOCUMENTS

| 8,902,643 B2 | 12/2014 | Berger et al. | |
| 2016/0180910 A1* | 6/2016 | Andre | G11C 7/1018 365/158 |
| 2018/0018134 A1* | 1/2018 | Kang | G11C 13/0004 |

* cited by examiner

*Primary Examiner* — Tha-O H Bui
(74) *Attorney, Agent, or Firm* — Bing K. Yen (57) ABSTRACT

The present invention is directed a method for programming multiple memory cells connected to a common word line to different resistance regimes. Each cell includes a bipolar switching memory element and an access transistor coupled in series between first and second conductive lines. The memory element and access transistor are disposed adjacent to the first and second conductive lines, respectively. The method includes the steps of applying a first voltage to the common word line to program a first group of memory cells to a first resistance regime; and after the first group of memory cells is programmed to the first resistance regime, programming a second group of memory cells to a second resistance regime by raising the potential of second conductive lines connected to the first group of memory cells to a second voltage and raising the first voltage of the common word line to a third voltage.

20 Claims, 7 Drawing Sheets

FIG. 1 PRIOR ART

WRITE TO LOW RESISTANCE

WRITE TO HIGH RESISTANCE

FAST PROGRAMMING OF MAGNETIC RANDOM ACCESS MEMORY (MRAM)

BACKGROUND

The present invention relates to non-volatile memory, and more particularly, to a method for programming bipolar switching non-volatile memory devices.

A bipolar switching memory device normally comprises an array of memory cells, each of which includes a non-volatile memory element and a selection element, such as transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

Figure 1:
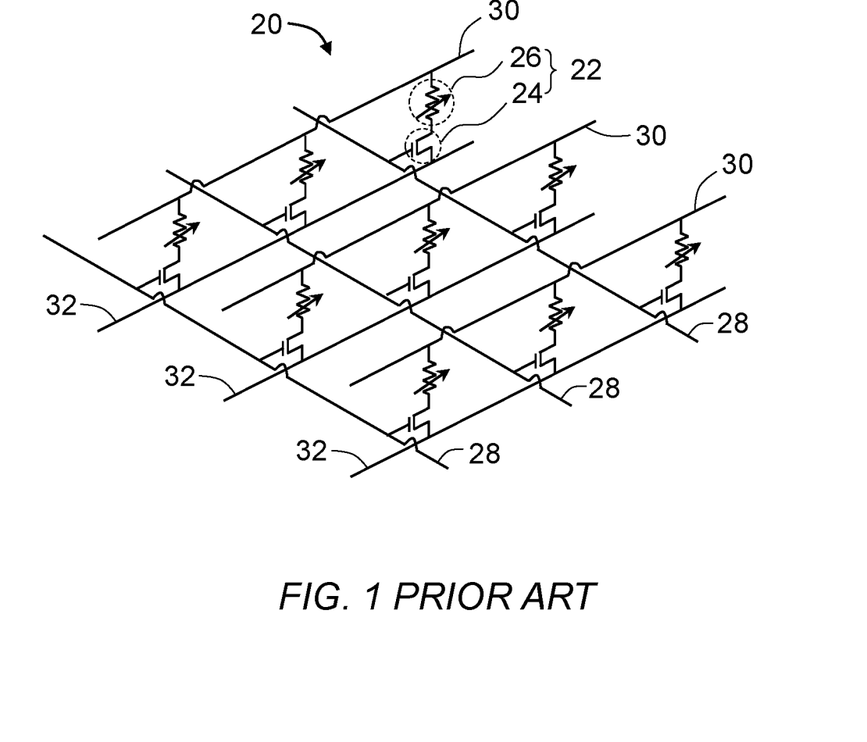
FIG. 1 is a circuit diagram illustrating an array of memory cells, each of which includes a bipolar switching memory element and an access transistor coupled in series between two conductive lines.

FIG. 1 is a schematic circuit diagram of a non-volatile memory array 20, which comprises a plurality of memory cells 22 with each of the memory cells 22 including an access transistor 24 coupled to a bipolar switching memory element 26; a plurality of parallel word lines 28 with each being coupled to the gates of a respective row of the access transistors 24 in a first direction; a plurality of parallel bit lines 30 with each being coupled to a respective row of the memory elements 26 in a second direction substantially perpendicular to the first direction; and a plurality of parallel source lines 32 with each being coupled to a respective row of the access transistors 24 in the second direction.

The bipolar switching memory element 26 may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage.

The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current or voltage to the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the magnetic reference layer. Therefore, the two stable resistance regimes enable the MTJ to serve as a non-volatile memory element.

Figure 2A:
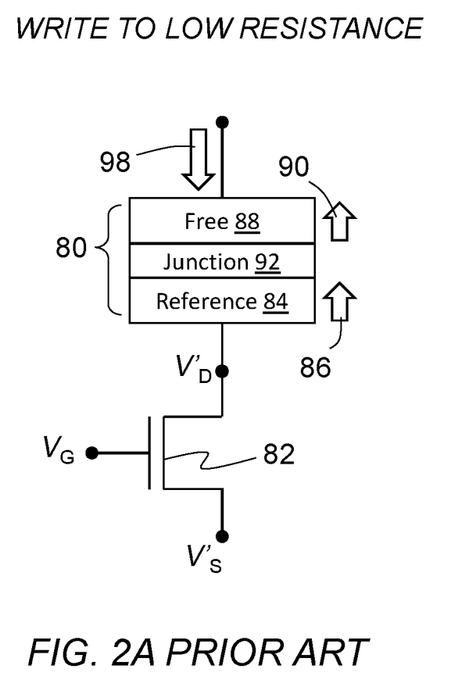
FIGS. 2A and 2B are schematic views illustrating programming operations for a magnetic memory to low and high resistance regimes, respectively.
Figure 2B:
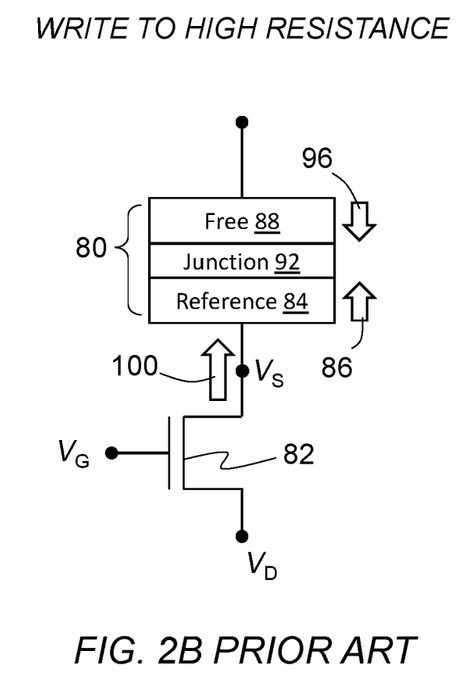

FIGS. 2A and 2B illustrate programming of a Spin-Transfer Torque (STT) MRAM cell including a perpendicular MTJ memory element 80 coupled to an access transistor 82 in series. The MTJ memory element 80 includes a magnetic reference layer 84 having an invariable magnetization direction 86 substantially perpendicular to the layer plane thereof and a magnetic free layer 88 having a variable magnetization direction 90 or 96 substantially perpendicular to the plane thereof, and a tunnel junction layer 92 interposed therebetween. FIG. 2A illustrates the programming process for switching the resistance state of the MTJ memory element 80 from high to low regime. As electrons that pass through the magnetic reference layer 84 are being spin-polarized, the spin-polarized electrons exert a spin transfer torque on the magnetic free layer 88, causing the magnetization direction of the magnetic free layer 88 to switch from the anti-parallel to parallel orientation 90 when the spin-polarized current or parallelizing current 98 exceeds a threshold level. It should be noted that the parallelizing write current 98 flows in the opposite direction as the electrons. Conversely, FIG. 2B illustrates the programming process for switching the resistance state of the MTJ memory element 80 from low to high regime. As electrons pass through the magnetic free layer 88, the electrons with the same spin direction as that of the magnetization in the magnetic reference layer 84 pass into the magnetic reference layer 84 unimpeded. However, the electrons with the opposite spin direction are reflected back to the magnetic free layer 88 at the boundary between the tunnel junction layer 92 and the magnetic reference layer 84, causing the magnetization direction of the magnetic free layer 88 to switch from the parallel to anti-parallel orientation 96 when the anti-parallelizing current 100 exceeds a threshold level.

While the MTJ memory element 80 shown in FIGS. 2A and 2B has the magnetic reference layer 84 disposed adjacent to the access transistor 82, the stacking order of the magnetic free layer 88 and the magnetic reference layer 84 may be inverted such that the magnetic free layer 88 is formed adjacent to the access transistor 82.

Because of the bipolar switching nature of the MTJ memory element 80, the source and drain polarity of the access transistor 82 needs to be reversed to provide switching currents 98 and 100 in opposite directions. In switching the MTJ memory element 80 from low to high resistance regime as shown in FIG. 2B, a high gate voltage $V_G$ is desired to drive the current 100 through the MTJ memory element 80 because the source voltage $V_S$ is at somewhat elevated level. However, the same high gate voltage $V_G$, when applied to the access transistor 82 for switching the MTJ memory element 80 from high to low resistance regime as shown in FIG. 2A, may damage the access transistor 82 because the high gate voltage may exceed maximum allowable gate-source voltage $V_{GS}$ with the source voltage $V'_S$ at or near ground potential. Accordingly, when programming two or more memory cells connected to a common word line to different resistance regimes, the maximum $V_G$ that can be reliably applied to the gate of the access transistor 82 through the common word line is limited to the maximum allowable gate-source voltage $V_{GS}$. While such a gate voltage may be adequate when switching the MTJ memory element 80 from high to low resistance regime, as shown in FIG. 2A, because the source voltage is low or essentially zero, the maximum allowable $V_{GS}$ applied to the gate may not be able to provide adequate current for switching the MTJ memory element 80 from low to high resistance regime, as shown in FIG. 2B, because the source voltage $V_S$ is at a somewhat elevated level, especially when the voltage drop across the MTJ memory element 80 is substantial.

For the foregoing reason, there is a need for a method to reliably program two or more memory cells connected to a common word line to different resistance regimes.

SUMMARY

The present invention is directed a method for programming multiple magnetic memory cells connected to a common word line to different resistance regimes. Each of the magnetic memory cells includes a magnetic memory element and an access transistor coupled in series between a first and a second conductive lines. The magnetic memory element and access transistor are disposed adjacent to the first and second conductive lines, respectively. The method includes the steps of applying a first voltage to the common word line to program a first group of magnetic memory cells to a first resistance regime; and after the first group of magnetic memory cells is programmed to the first resistance regime, programming a second group of magnetic memory cells to a second resistance regime by raising the potential of second conductive lines connected to the first group of magnetic memory cells to a second voltage and raising the first voltage of the common word line to a third voltage. The third voltage is greater than a limiting voltage and the difference between the third voltage and the second voltage is less than or equal to the limiting voltage.

According to another aspect of the present invention, a method for programming multiple magnetic memory cells connected to a common word line to different logical states including the steps of applying a first voltage to one or more first conductive lines connected to a first group of one or more of the multiple memory cells; applying a second voltage, which is less than the first voltage, to one or more second conductive lines connected to the first group of one or more of the multiple memory cells; applying a third voltage to one or more first conductive lines connected to a second group of one or more of the multiple memory cells; applying a fourth voltage, which is greater than the third voltage, to one or more second conductive lines connected to the second group of one or more of the multiple memory cells; and applying a fifth voltage, which is greater than the second voltage, to the common word line. After the first group of one or more of the multiple memory cells is programmed to a first logical state, the second group of one or more of the multiple memory cells is programmed to a second logical state by raising the second voltage applied to the one or more second conductive lines connected to the first group of one or more of the multiple memory cells to a sixth voltage and raising the fifth voltage applied to the common word line to a seventh voltage. The seventh voltage is greater than a limiting voltage but the difference between the seventh voltage and the sixth voltage is less than or equal to the limiting voltage.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Figure 3:
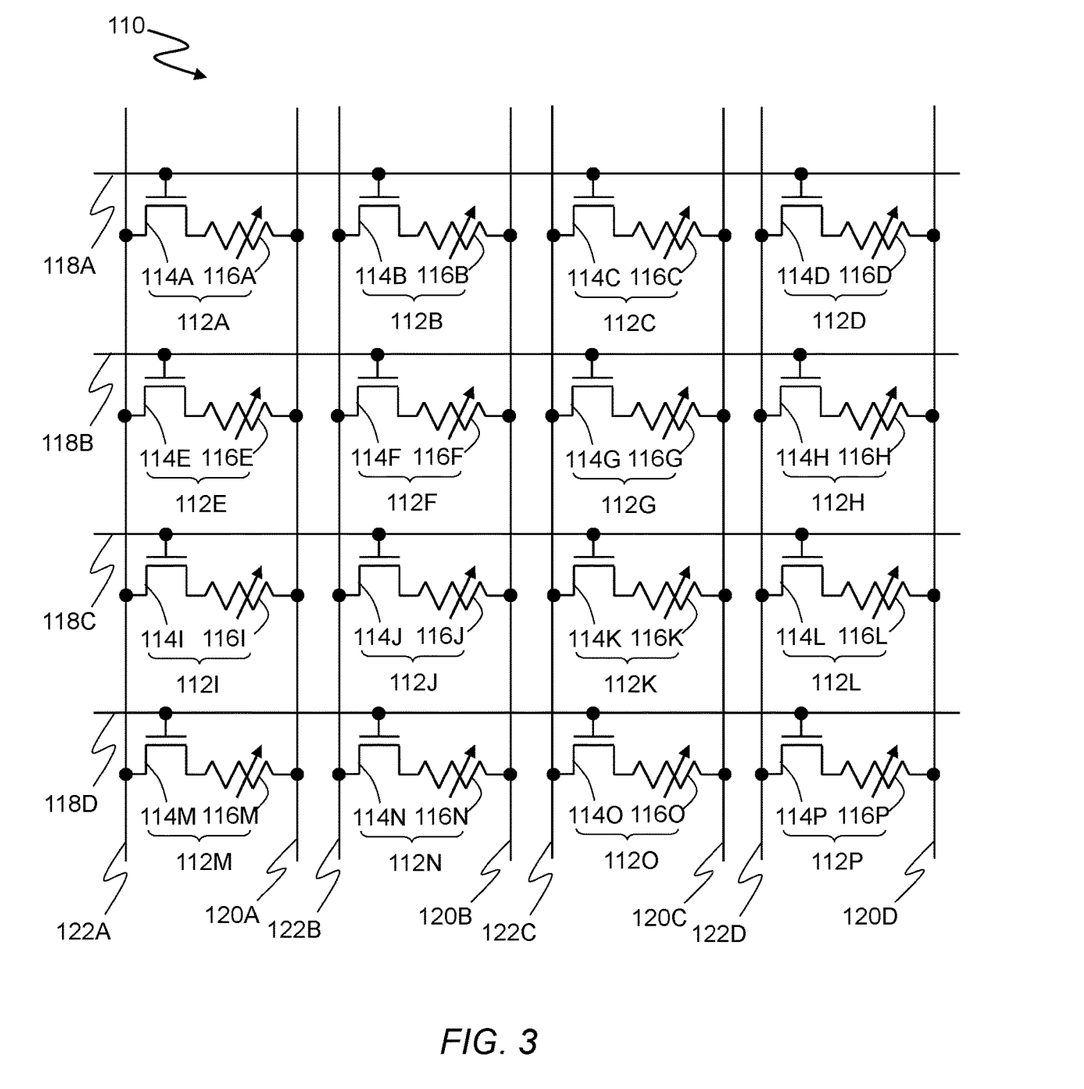
FIG. 3 is a schematic circuit diagram illustrating an array of memory cells, each of which includes a bipolar switching memory element and an access transistor coupled in series between two conductive lines.

FIG. 3 is a schematic circuit diagram for a non-volatile memory array 110, which includes a plurality of memory cells arranged in rows and columns, as represented by memory cells 112A-112P. Each of the memory cells 112A-112P includes a respective one of access transistors 114A-114P and a respective one of bipolar switching memory elements 116A-116P coupled in series. The bipolar switching memory elements 116A-116P may switch their resistance state by any suitable switching mechanism, such as but not limited to phase change, precipitate bridging, magnetoresistive switching, or any combination thereof. In one embodiment, each of the memory elements 116A-116P comprises a phase change chalcogenide compound, such as but not limited to $Ge_2Sb_2Te_5$ or AgInSbTe, which can switch between a resistive phase and a conductive phase. In another embodiment, each of the memory elements 116A-116P comprises a nominally insulating metal oxide material, such as but not limited to NiO, $TiO_2$, or $Sr(Zr)TiO_3$, which can switch to a lower electrical resistance state as the metal rich precipitates grow and link to form conductive paths upon application of an appropriate voltage. In still another embodiment, each of the memory elements 116A-116P comprises an MTJ that includes a magnetic free layer and a magnetic reference layer with an insulating electron tunnel junction layer interposed therebetween. The magnetic reference layer of the MTJ memory element may be disposed adjacent to the access transistor as shown in FIGS. 2A and 2B. Alternatively, the structure of the MTJ memory element may be inverted such that the magnetic free layer is disposed adjacent to the access transistor.

The memory array 110 further includes a plurality of word lines represented by lines 118A-118D extending along a row direction, a plurality of first conductive lines represented by lines 120A-120D extending along a column direction, and a plurality of second conductive lines represented by lines 122A-122D extending along the column direction. Each of the word lines 118A-118D is connected to the gates of the access transistors of a respective row of the memory cells 112A-112P along the row direction. Each of the first conductive lines 120A-120D is connected to the bipolar switching memory elements of a respective column of the magnetic memory cells 112A-112P along the column direction. Each of the second conductive lines 122A-122D is connected to the source or drain of the access transistors of a respective column of the memory cells 112A-112P along the column direction. The first and second conductive lines 120A-120D and 122A-122D may function as bit lines and sources lines, respectively, or vice versa.

When writing data to the memory array 110, it is desirable to program multiple memory cells, which may correspond to one or more bytes, words, or pages, connected to a common word line once the word line is activated. For example and without limitation, programming a row of memory cells, say the memory cells 112E-112H, connected to a common word line (i.e., 118B) to first, second, first, and second resistance regimes, respectively, begins by selecting the common word line 118B by applying a first voltage to turn on the access transistors 114E-114H while keeping the voltage of the rest of unselected word lines 118A, 118C, and 118D at a standby voltage that ranges from ground potential to a level below the threshold voltage of the access transistor. Meanwhile, the potential of the first conductive lines 120B and 120D, which are connected to the memory cells 112F and 112H, respectively, are lowered from a first standby voltage to a second voltage, and the potential of the corresponding second conductive lines 122B and 122D are raised to a third voltage, which is higher than the second voltage, from a second standby voltage; the potential of the first conductive lines 120A and 120C, which are connected to the memory cells 112E and 112G, respectively, are raised from the first standby voltage to a fourth voltage, and the potential of the corresponding second conductive lines 122A and 122C are lowered to a fifth voltage, which is less than the fourth voltage, from the second standby voltage, as illustrated by the timing diagram 130 in FIG. 4.

Figure 4:
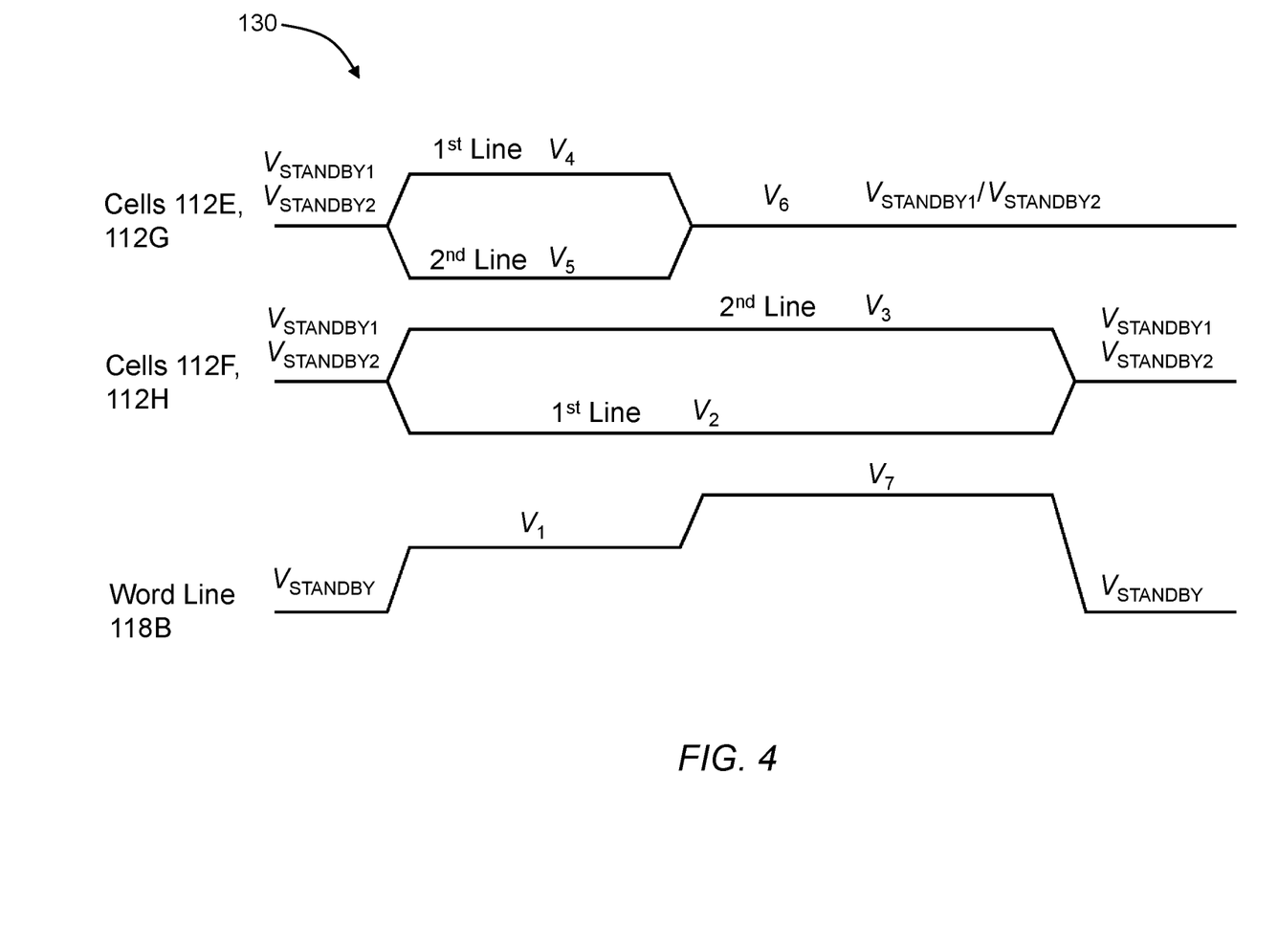
FIG. 4 is an exemplary timing diagram for programming multiple memory cells connected to a common word line to different logical states in accordance with an embodiment of the present invention.

The gate-source voltage on the access transistors 114E and 114G, which corresponds to the voltage difference between the first voltage applied to the common word line 118B and the fifth voltage applied to the second conductive lines 122A and 122C, may be sufficiently high to generate switching currents flowing from the first conductive lines 120A and 120C to the second conductive lines 122A and 122C for programming the memory element 116E and 116G to the first resistance regime. By contrast, the gate-source voltage on the access transistors 114F and 114H may be insufficient to generate high enough currents flowing from the second conductive lines 122B and 122D to the first conductive lines 120B and 120D for programming the memory elements 116F and 116H to the second resistance regime.

With continuing reference to FIG. 4, after the memory elements 116E and 116G are programmed to the first resistance regime, the programming process for the remaining memory cells 112F and 112H continues by raising the potential of the second conductive lines 122A and 122C from the fifth voltage to a sixth voltage and boosting the potential of the common word line 118B from the first voltage to a seventh voltage. The sixth voltage may be correspond to the second standby voltage. The potential of the first conductive lines 120A and 120C may be lowered from the fourth voltage back to the first standby voltage as shown in FIG. 4. Alternatively, the fourth voltage of the first conductive lines 120A and 120C may be lowered at a later time that is before or at the end of the complete programming process (i.e., when the word line voltage becomes zero again). After boosting the potential of the common word line 118B to the seventh voltage, the gate-source voltage of the access transistors 114F and 114H may be sufficiently high to generate switching currents flowing from the second conductive lines 122B and 122D to the first conductive lines 120B and 120D for programming the memory elements 116F and 116H to the second resistance regime, after which the potential of the word line 118B may return to the standby voltage, and the potential of the first conductive lines 120B and 120D and the potential of the second conductive lines 122B and 122D may return to the first and second standby voltages, respectively.

Figure 5:
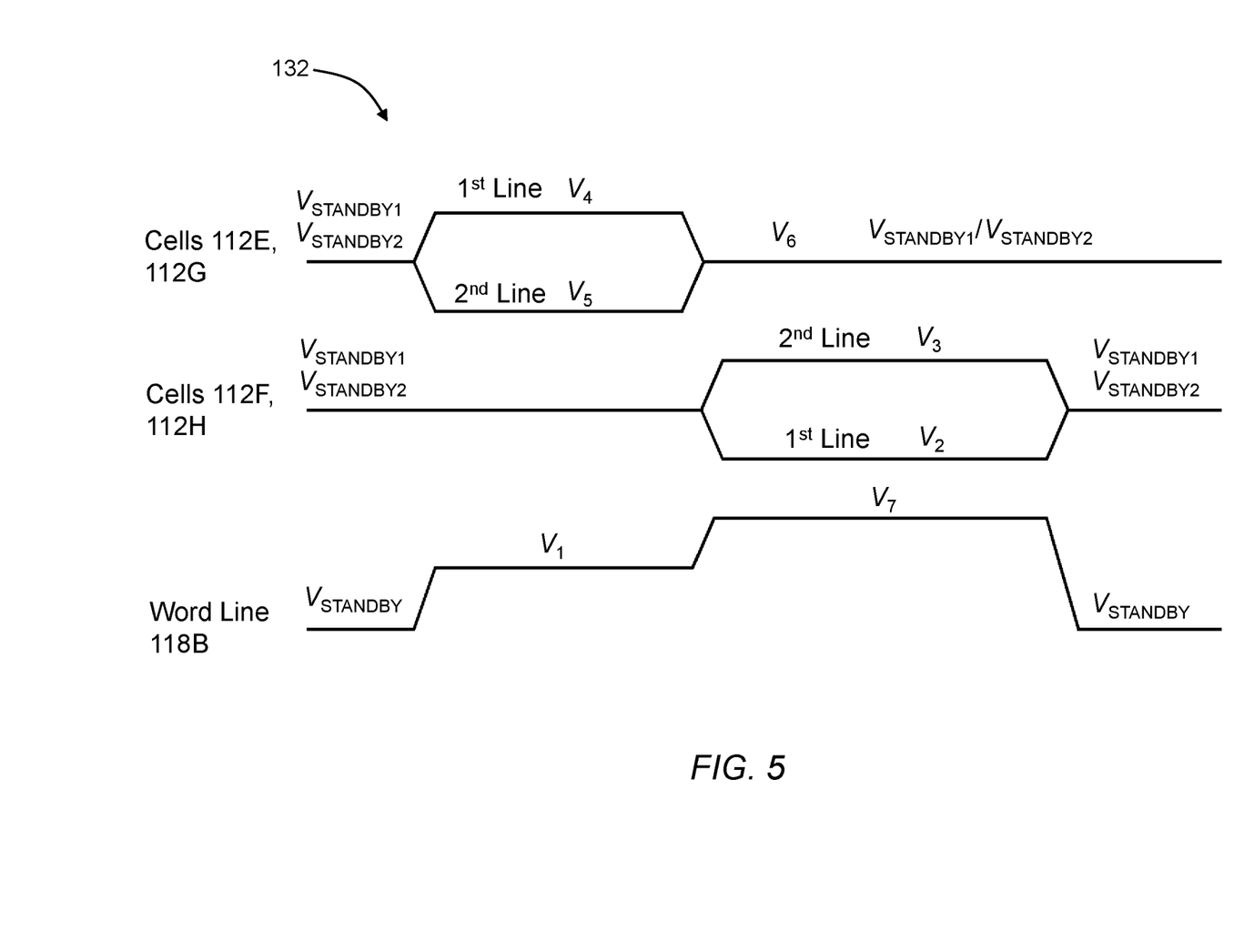
FIG. 5 is an exemplary timing diagram for programming multiple memory cells connected to a common word line to different logical states in accordance with another embodiment of the present invention.

The exemplary timing diagram 130 shows that the starting point for programming the memory cells 112F and 112H, which corresponds to decreasing the potential of the first conductive lines 120B and 120D from the first standby voltage to the second voltage and increasing the potential of the second conductive lines 122B and 122D to the third voltage from the second standby voltage, is same as that for the memory cells 112E and 112G and occurs at the beginning of the overall programming operation. However, the present invention can accommodate a later starting point for programming the memory cells 112F and 112H, ranging from the beginning of the overall programming operation (i.e., FIG. 4) up until when the potential of the common word line 118B is boosted from the first voltage to the seventh voltage, as shown in FIG. 5.

The present invention allows the boosting of the gate voltage to a level higher than the maximum allowable gate-source voltage of the access transistors 114E-114H by increasing the potential of the second conductive lines 122A and 122C, thereby maintaining the gate-source voltage of the access transistors 114E and 114G at or below a critical level. Accordingly, the seventh voltage may be higher than the maximum allowable gate-source voltage of the access transistors 114E-114H but the difference between the seventh voltage and the sixth voltage may be less than or equal to the maximum allowable gate-source voltage of the access transistors 114E-114H.

The first and second resistance regimes may correspond to the high and low resistance regimes, respectively. Alternatively, the first and second resistance regimes may correspond to the low and high resistance regimes, respectively. Accordingly, the first and second resistance regimes may correspond to different logical states (i.e., "0" and "1"). The first voltage may be greater than or equal to the threshold voltage of the access transistor. The first and second standby voltages can be any values between zero and a power supply voltage (e.g., $V_{DD}$). In an embodiment, the first and second standby voltages are the same as shown in the timing diagram of FIG. 4. In another embodiment, the first and second standby voltages are about half of a power supply voltage (e.g., $V_{DD}/2$). In still another embodiment, the third and fourth voltages correspond to a power supply voltage (e.g., $V_{DD}/2$). In yet another embodiment, the second and fifth voltages correspond to ground potential or 0 V. In still yet another embodiment, the sixth voltage corresponds to the second standby voltage.

Figure 6:
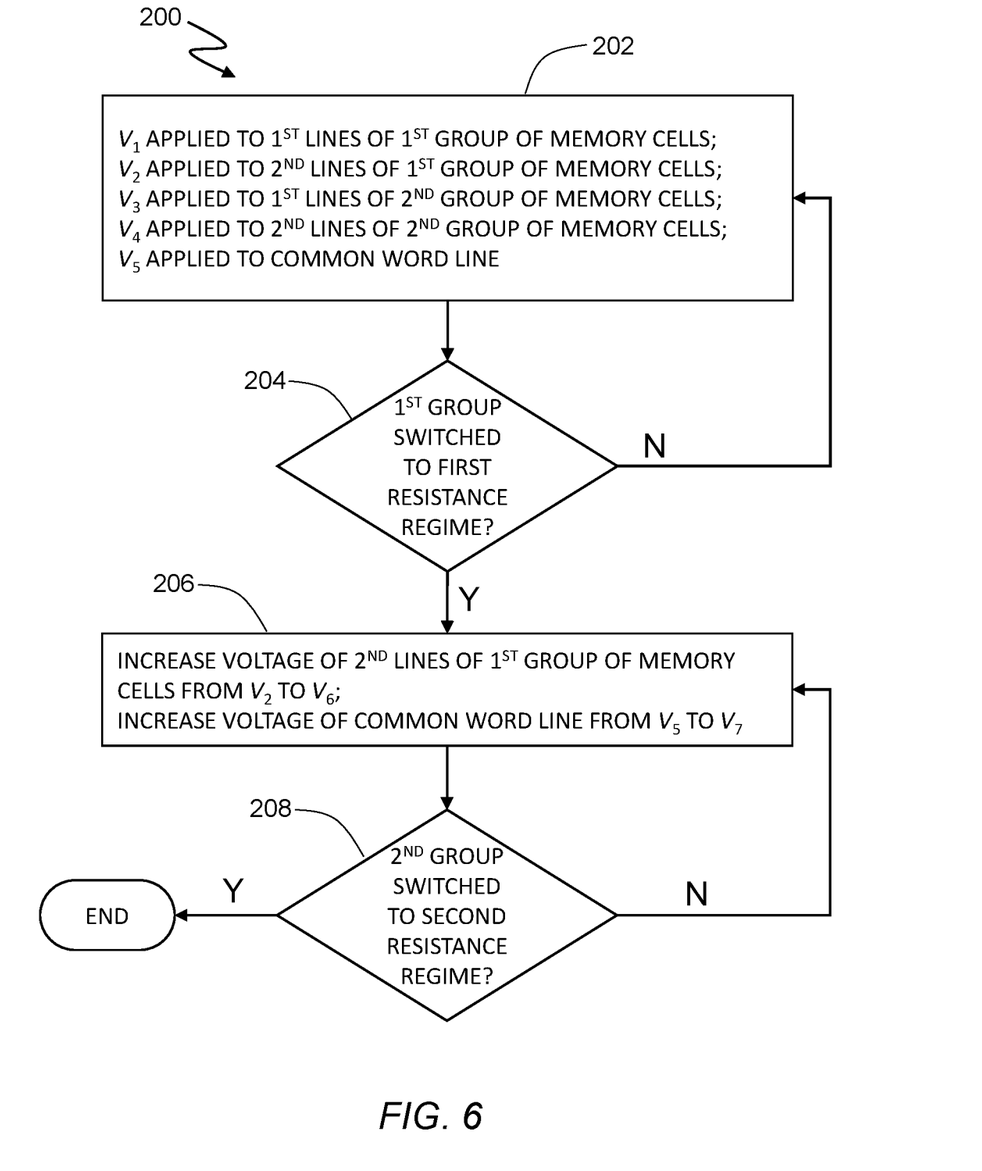
FIG. 6 is a flow chart illustrating the steps of programming multiple memory cells connected to a common word line to different logical states in accordance with an embodiment of the present invention.

FIG. 6 is a flow chart of selected steps 200 in accordance with a method embodiment of the present invention for programming multiple memory cells (e.g., 112E-112H) connected to a common word line (e.g., 118B) to different logical states (e.g., "0" and "1") or resistance regimes (e.g., high and low). Each of the multiple memory cells includes a memory element (e.g., 116E) and an access transistor (e.g., 114E) coupled in series between a first conductive line (e.g., 120A) and a second conductive line (e.g., 122A) with the memory element being adjacent to the first conductive line and the access transistor being adjacent to the second conductive line.

The programming steps 200 begin at step 202, where a first voltage is applied to one or more first conductive lines connected to a first group of one or more of the multiple memory cells (e.g., 112E and 112G); a second voltage, which is less than the first voltage, is applied to one or more second conductive lines connected to the first group of one or more of the multiple memory cells; a third voltage is applied to one or more first conductive lines connected to a second group of one or more of the multiple memory cells (e.g., 112F and 112H); a fourth voltage, which is greater than the third voltage, is applied to one or more second conductive lines connected to the second group of one or more of the multiple memory cells; and a fifth voltage, which is greater than the second voltage, is applied to the common word line to turn on access transistors (e.g., 114E-114H) connected thereto. The application of the first, second, and fifth voltages may generate a current that is sufficiently high to program the resistance state of the memory elements (e.g., 116E and 116G) of the first group of memory cells to a first resistance regime. By contrast, the application of the third, fourth, and fifth voltages may not generate a current that is sufficiently high to program the resistance state of the memory elements (e.g., 116F and 116H) of the second group of memory cells to a second resistance regime because the corresponding source voltage is relatively higher than that of the first group of memory cells, thereby reducing the gate-source voltage and the currents flowing through the second group of memory cells. The first and second resistance regimes may correspond to the low and high resistance regimes, respectively. Alternatively, the first and second resistance regimes may correspond to the high and low resistance regimes, respectively. In an embodiment, the first and fourth voltages correspond to the power supply voltage $V_{DD}$. In another embodiment, the second and third voltages correspond to the ground potential or 0 volt. The application of the third and fourth voltages to the second group of memory cells may be initiated at the same time as or later than or earlier than the application of the first and second voltages to the first group of memory cells. In an embodiment, the applications of the first, second, third, fourth, and fifth voltages are initiated at substantially the same time (e.g., FIG. 4).

After step 202, the process continues to step 204, where a decision is made as to whether the first group of memory cells have been programmed to the first resistance regime. If so, the programming operation advances to step 206. Otherwise, the process loops back to step 202. At step 206, the second voltage applied to the one or more second conductive lines connected to the first group of memory cells is increased to a sixth voltage and the fifth voltage applied to the common word line is increased to a seventh voltage. The seventh voltage may be greater than the maximum allowable gate-source voltage of the access transistor, but the difference between the seventh voltage and the sixth voltage may be less than or equal to the maximum allowable gate-source voltage of the access transistor. The application of the third, fourth, and seventh voltages may generate a current that is sufficiently high to program the resistance state of the memory elements (e.g., 116F and 116H) of the second group of memory cells to a second resistance regime.

After step 206, the process continues to step 208, where a decision is made as to whether the second group of memory cells have been programmed to the second resistance regime. If so, the programming operation is terminated. Otherwise, the process loops back to step 206.

Figure 7:
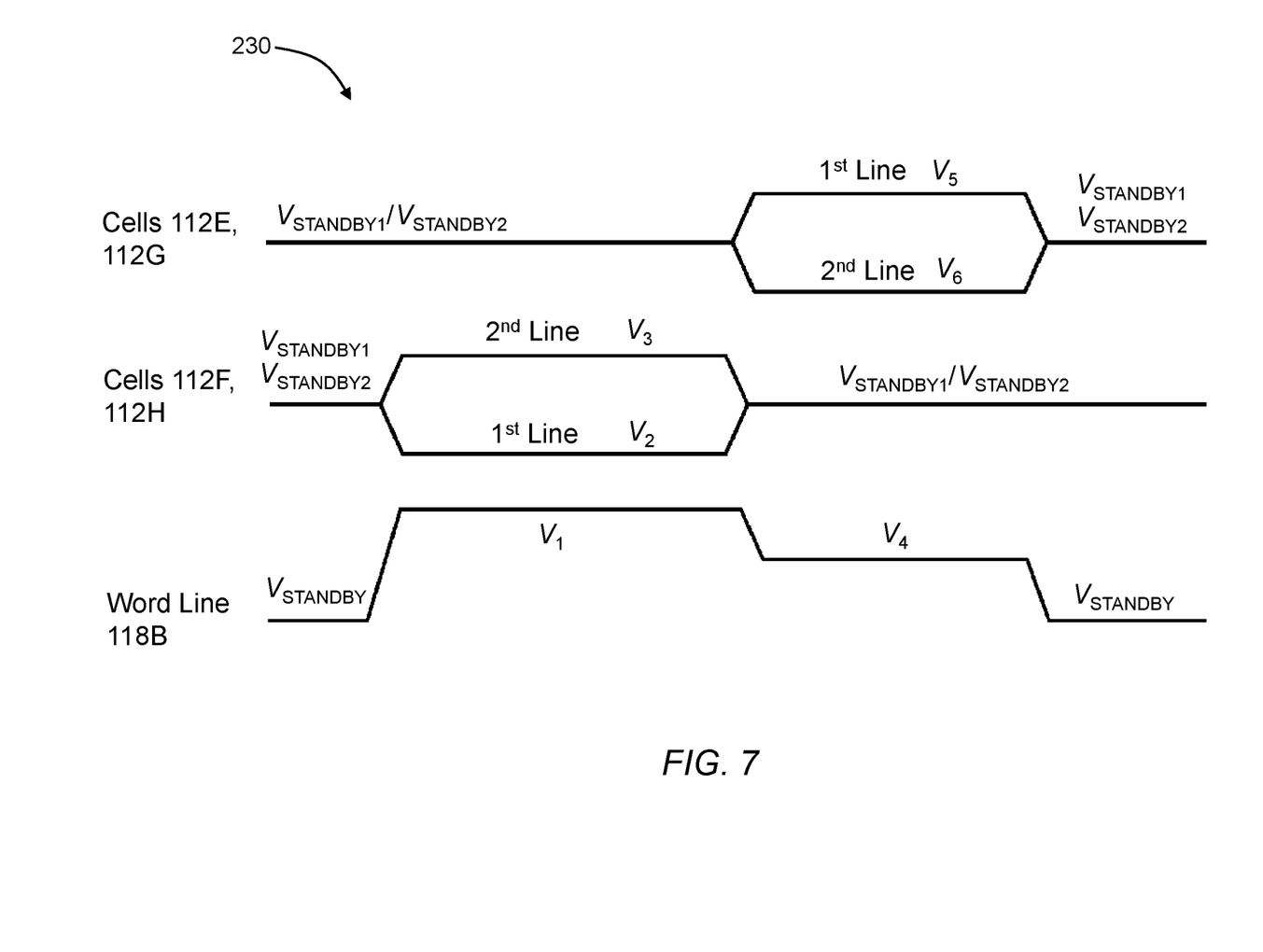
FIG. 7 is an exemplary timing diagram for programming multiple memory cells connected to a common word line to different logical states in accordance with still another embodiment of the present invention.

While the timing diagrams 130 and 132 of FIGS. 4 and 5 show that the memory cells 112E and 112G are first programmed to the first resistance regime and the memory cells 112F and 112H are programmed to the second resistance regime thereafter, the present invention can also accommodate the reverse order of programming as shown in FIG. 7.

FIG. 7 illustrates a timing diagram 230 for programming multiple memory cells connected to a common word line to different resistance regimes or logical states in accordance to another embodiment of the present invention. Using the row of memory cells 112E-112H shown in FIG. 3 as an example, the programming process begins by applying a first voltage to the common word line 118B connected to the memory cells 112E-112H, applying a second voltage to the first conductive lines 120B and 120D connected to the memory cells 112F and 112H, and applying a third voltage that is higher than the second voltage to the second conductive lines 122B and 122D connected to the memory cells 112F and 112H; while leaving the second conductive lines 122A and 122C connected to the memory cells 112E and 112G in a second standby voltage. The first conductive lines 120A and 120C connected to the memory cells 112E and 112G may remain in a first standby voltage. The application of the first, second, and third voltages may generate a current that is sufficiently high to program the resistance state of the memory elements 116F and 116H to a second resistance regime. The first voltage may be greater than the maximum allowable gate-source voltage of the access transistors 114E-114H, but the difference between the first voltage and the second standby voltage may be less than or equal to the maximum allowable gate-source voltage of the access transistors 114E-114H. The first and second standby voltages may range from ground potential to a power supply voltage (e.g., $V_{DD}$). In an embodiment, the first and second standby voltages are the same and correspond to half of the power supply voltage (e.g., $V_{DD}/2$).

After the memory elements 116F and 116H of memory cells 112F and 112H are programmed to the second resistance regime, the programming process for the remaining memory cells 112E and 112G continues by decreasing the potential of the common word line 118B from the first voltage to a fourth voltage, increasing the potential of the first conductive lines 120A and 120C to a fifth voltage from the first standby voltage, and decreasing the potential of the second conductive lines 122A and 122C to a sixth voltage, which is lower than the fifth voltage, from the second standby voltage. The application of fourth, fifth, and sixth voltages programs the memory cells 112E and 112G to the first resistance regime. Meanwhile, the voltages of the first conductive lines 120B and 120D and the second conductive lines 122B and 122D connected to the memory cells 112F and 112H may return to the first and second standby voltages, respectively.

The first and second resistance regimes may correspond to the high and low resistance regimes, respectively. Alternatively, the first and second resistance regimes may correspond to the low and high resistance regimes, respectively. The first and second resistance regimes may correspond to different logical states (i.e., "0" and "1"). The first and second standby voltages may have any values ranging from ground potential to a power supply voltage (e.g., $V_{DD}$). In an embodiment, the first and second standby voltages are the same and may correspond to half of a power supply voltage (e.g., $V_{DD}/2$). The second and sixth voltages may correspond to ground potential or 0 V. The third and fifth voltages may correspond to a power supply voltage (e.g., $V_{DD}$). The fourth voltage may be lower than or equal to the maximum allowable gate-source voltage of the access transistors 114E-114H.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, 6. In particular, the use of "step of" in the claims herein is not intended to invoke the provisions of 35 U.S.C. § 112, 6.

What is claimed is:

1. A method for programming multiple memory cells connected to a common word line to different logical states, each of the multiple memory cells including a memory element and an access transistor coupled in series between a first conductive line and a second conductive line with the memory element being adjacent to the first conductive line and the access transistor being adjacent to the second conductive line, the method including the steps of:
   applying a first voltage to one or more first conductive lines connected to a first group of one or more of the multiple memory cells;
   applying a second voltage, which is less than the first voltage, to one or more second conductive lines connected to the first group of one or more of the multiple memory cells;
   applying a third voltage to one or more first conductive lines connected to a second group of one or more of the multiple memory cells;
   applying a fourth voltage, which is greater than the third voltage, to one or more second conductive lines connected to the second group of one or more of the multiple memory cells;
   applying a fifth voltage, which is greater than the second voltage, to the common word line; and
   after the first group of one or more of the multiple memory cells are programmed to a first logical state, programming the second group of one or more of the multiple memory cells to a second logical state by:
      raising the second voltage applied to the one or more second conductive lines connected to the first group of one or more of the multiple memory cells to a sixth voltage; and
      raising the fifth voltage applied to the common word line to a seventh voltage,
      wherein the seventh voltage is greater than a limiting voltage and a difference between the seventh voltage and the sixth voltage is less than or equal to the limiting voltage.

2. The method of claim 1, wherein the limiting voltage corresponds to a maximum allowable gate-source voltage of the access transistor.

3. The method of claim 1, wherein a difference between the fifth voltage and the second voltage is less than or equal to the limiting voltage.

4. The method of claim 3, wherein the limiting voltage corresponds to a maximum allowable gate-source voltage of the access transistor.

5. The method of claim 1, wherein the first voltage corresponds to a power supply voltage.

6. The method of claim 1, wherein the second voltage corresponds to a ground potential.

7. The method of claim 1, wherein the third voltage corresponds to a ground potential.

8. The method of claim 1, wherein the fourth voltage corresponds to a power supply voltage.

9. The method of claim 1, wherein the memory element includes a magnetic tunnel junction.

10. The method of claim 1, wherein the first logical state corresponds to a low resistance regime of the memory element.

11. The method of claim 1, wherein the first logical state corresponds to a high resistance regime of the memory element.

12. The method of claim 1, wherein the steps of applying the third and fourth voltages and the steps of applying the first and second voltages are carried out at the same time.

13. The method of claim 1, wherein the steps of applying the third and fourth voltages are carried out after the steps of applying the first and second voltages.

14. A method for programming multiple magnetic memory cells connected to a common word line to different resistance regimes, each of the multiple magnetic memory cells including a magnetic memory element and an access transistor coupled in series between a first conductive line and a second conductive line with the magnetic memory element being adjacent to the first conductive line and the access transistor being adjacent to the second conductive line, the method including the steps of:
   applying a first voltage to the common word line to program a first group of one or more of the multiple magnetic memory cells to a first resistance regime; and after the first group of one or more of the multiple magnetic memory cells is programmed to the first resistance regime, programming a second group of one or more of the multiple magnetic memory cells to a second resistance regime by:

raising a potential of one or more second conductive lines connected to the first group of one or more of the multiple magnetic memory cells to a second voltage; and raising the first voltage of the common word line to a third voltage, wherein the third voltage is greater than a limiting voltage, and a difference between the third voltage and the second voltage is less than or equal to the limiting voltage.

15. The method of claim 14, wherein the limiting voltage corresponds to a maximum allowable gate-source voltage of the access transistor.

16. The method of claim 14, wherein the first resistance regime has lower resistance than the second resistance regime.

17. The method of claim 14, wherein the first resistance regime has higher resistance than the second resistance regime.

18. The method of claim 14, wherein currents having opposite directions are used to program the multiple magnetic memory cells to the first and second resistance regimes, respectively.

19. The method of claim 14, wherein the magnetic memory element includes a magnetic free layer and a magnetic reference layer with an insulating tunnel junction layer interposed therebetween.

20. A method for programming multiple magnetic memory cells connected to a common word line to different resistance regimes, each of the multiple magnetic memory cells including a magnetic memory element and an access transistor coupled in series between a first conductive line and a second conductive line with the magnetic memory element being adjacent to the first conductive line and the access transistor being adjacent to the second conductive line, the method including the steps of:

applying a voltage to the common word line to program a first group of one or more of the multiple magnetic memory cells to a first resistance regime; and raising the voltage of the common word line to program a second group of one or more of the multiple magnetic memory cells to a second resistance regime.

\* \* \* \* \*